United States Patent [19]

Tamanoi

[11] Patent Number: 5,489,867
[45] Date of Patent: Feb. 6, 1996

[54] DISPLAY DATA DRIVING INTEGRATED CIRCUIT

[75] Inventor: Yutaka Tamanoi, Kawasaki, Japan

[73] Assignee: Kabushiki Kaisha Toshiba, Kawasaki, Japan

[21] Appl. No.: 262,875

[22] Filed: Jun. 21, 1994

[30] Foreign Application Priority Data

Jun. 21, 1993 [JP] Japan .................................. 5-148973

[51] Int. Cl.⁶ .................................................. H03H 11/26
[52] U.S. Cl. .............................. 327/269; 327/270; 345/98
[58] Field of Search ................................... 327/149, 158,
327/250, 251, 269, 270; 326/93, 96; 345/94,
98, 99, 100; 347/237, 238, 247

[56]  References Cited

FOREIGN PATENT DOCUMENTS 3-191409  8/1991  Japan .
4-282610  10/1992  Japan .

Primary Examiner—Timothy P. Callahan
Assistant Examiner—Jeffrey Zweizig
Attorney, Agent, or Firm—Oblon, Spivak, McClelland, Maier & Neustadt

[57] ABSTRACT

In a display data driving IC for driving a matrix display unit, switching current in a plurality of channel driving buffer circuits is suppressed, and when a multi-tone display unit is driven, the tone display quality is improved. The present invention is characterized by comprising a plurality of channel driving buffer circuits to which the individual bit signals of parallel display data are supplied and which, receiving an operation control signal, amplify the individual bit signals or perform voltage level conversion and output the resulting signals, a plurality of control signal supply lines for supplying the operation control signal to each of a plurality of groups into which the driving buffer circuits are divided, a single operation control signal input terminal to which an operation control signal for controlling the operation of the buffer circuits is supplied, and an operation control signal distribution circuit for distributing the operation control signal input to the plurality of control signal supply lines with a specific timing relationship.

8 Claims, 6 Drawing Sheets

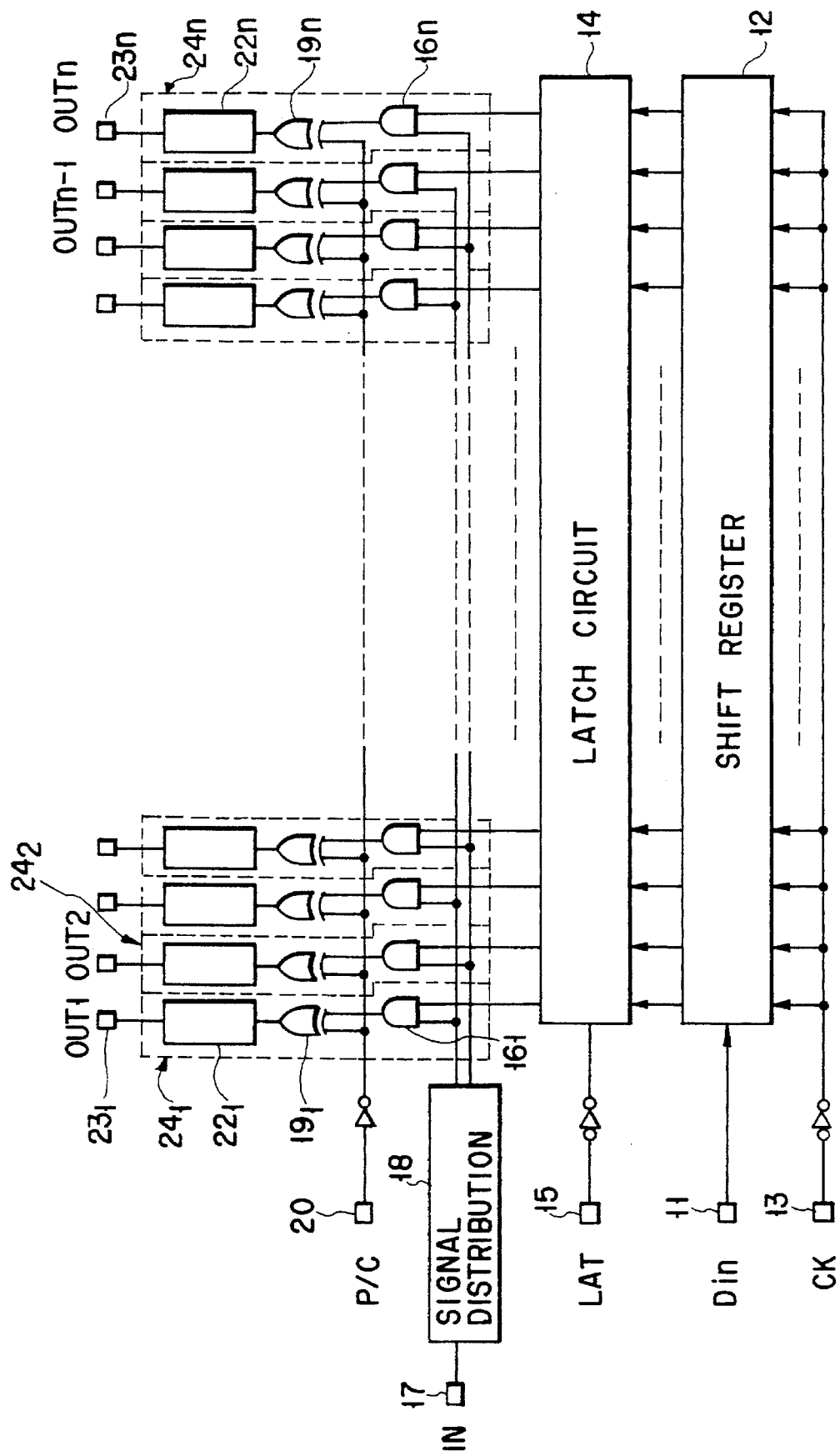
F I G. 5

DISPLAY DATA DRIVING INTEGRATED CIRCUIT

BACKGROUND OF THE INVENTION

1. Field of the Invention

This invention relates to a display data driving integrated circuit (IC) for driving a matrix display unit, and more particularly to a control circuit for controlling the operation timing relationship between the groups of display driving signal output driving buffer circuits.

2. Description of the Related Art

A display data driving IC for driving a matrix display unit (e.g., a liquid-crystal unit, EL (electroluminescence) display unit, a fluorescent display unit, or a DC plasma display unit) by a dynamic technique basically performs serial/parallel conversion of serially inputted display data signals, and outputs the parallel display data to the outside via the groups of display driving signal output driving buffer circuits and the groups of output terminals.

FIG. 1 shows an example of the display driving signal output driving buffer circuit section in a conventional display data driving IC.

Numerals $71_1$ to $71_n$ indicate a plurality of buffer circuits (e.g., as many buffers as suffices for 64 bits or 64 channels); $72_1$ to $72_n$ represent output terminals provided so as to correspond to the driving buffer circuits $71_1$ to $71_n$; 73 denotes a single operation control signal input terminal to which an operation control signal IN is supplied; and 741 and 742 indicate inverter circuits for waveform-shaping the input signal for the control terminal 73 and supplying it to a single operation control signal line 75.

The driving buffer circuits $71_1$ to $71_n$ are supplied with the individual bit signals of 64 bits of parallel display data, respectively, from a serial/parallel converter circuit 76, and are all supplied with the operation control signal from the operation control signal line 75.

FIG. 2 shows an example of the operation of the driving buffer circuit section in FIG. 1.

When the operation control signal is activated, the driving buffer circuits $71_1$ to $71_n$ amplify the respective bit signals of the parallel display data using the buffers, and then supplies output signals $OUT_1$ to $OUT_n$ to the output terminals $72_1$ to $72_n$. The output signals $OUT_1$ to $OUT_n$ are supplied to a matrix liquid-crystal unit (not shown) as a dynamic driving signal.

As seen from the timing waveform diagram in FIG. 2, however, in the driving buffer circuit section of FIG. 1, the driving buffer circuits $71_1$ to $71_n$ for 64 bits operate simultaneously on the basis of the operation control signal supplied from the control signal line 75.

Therefore, when the level of each of the data inputs to the driving buffer circuits $71_1$ to $71_n$ are switched (to the inverted level), a large switching current will flow because of simultaneous operation of the driving buffer circuits $71_1$ to $71_n$, thus making switching noise greater.

The switching noise can cause faulty operation of the other circuits in the display data driving IC or of the input circuits of the other ICs connected to the same power line to which the display data driving IC are connected. When the display data driving IC is composed of a CMOS IC, the switching noise acts as the trigger to induce a latch-up phenomenon.

When electronic equipment such as a word processor, a lap-top or notebook personal computer, or a game machine with a liquid-crystal display is provided with the display data driving IC, electromagnetic interference (EMI), part of the specification of the electronic equipment can be induced.

Liquid-crystal display units are now using more and more channels as their screens become larger, and the number of the driving buffer circuits used has almost reached 280. Furthermore, the driving buffer circuits have the function of converting a logic-level signal into a high driving voltage and outputting the high voltage, the absolute value of the amplitude of the recent liquid-crystal driving voltage has reached nearly as high as 40 to 60 V, as compared with a conventional liquid-crystal driving voltage whose absolute value was nearly 20 to 30 V.

Thus, in such a situation, the switching noise tends to become much larger, making the noise problem much more serious.

FIG. 3 shows an example of the display driving signal output driving buffer section in another conventional display data driving IC which are designed to alleviate the problems described above.

FIG. 4 shows an example of the operation of the circuit in FIG. 3.

The driving buffer circuit section in FIG. 3 differs from that of FIG. 1, in that the input signal IN from an operation control signal input terminal 73 is waveform-shaped by inverter circuits 741, 742, and the shaped signal is supplied to a first control signal line 751, that the signal on the first control signal 751 is waveform-shaped by inverter circuits 743, 744 and the shaped signal is supplied to a second control signal line 752, and that the odd-numbered (odd channel) ones of the driving buffer circuits $71_1$ to $71_n$ are all supplied with the operation control signal from the first control signal line 751, and the even-numbered (even channel) driving buffer circuits are all supplied with the operation control signal from the second control signal line 752.

Therefore, because half of the driving buffer circuits $71_1$ to $71_n$ operate with a little different timing from that of the other half by two phases of the operation control signal, even when the level of each of the driving buffer circuits $71_1$ to $71_n$ is switched (to the inverted level), the entire switching current of the driving buffer circuits $71_1$ to $71_n$ is suppressed, thereby minimizing switching noise.

However, because the driving buffer circuit section of FIG. 3 is controlled by two phases of the operation control signal, the output signal group consequently has 10 two phases, thus degrading the display quality of the matrix liquid-crystal display unit driven by the output signal group.

Particularly, when a multi-gradation (i.e., multi-tone) liquid-crystal unit widely used in the recent electronic equipment with liquid-crystal display is driven by the driving buffer circuit of FIG. 3, the phase difference between driving signal groups changes the absolute value of the liquid-crystal applied voltage, making it impossible to obtain the desired tone display.

As described above, the conventional display data driving IC has the problem that simultaneous operation of the channel driving buffer circuits causes a large switching current to flow as a whole, making switching noise larger. Furthermore, when the operation control signal is allowed to have a phase difference to suppress the switching current in the channel driving buffer circuits, this introduces the problem of being unable to obtain the desired multi-tone display when driving a multi-tone display unit.

SUMMARY OF THE INVENTION

To overcome the above-described problems, it is the object of the present invention to provide a display data driving IC capable of not only suppressing the switching current in the multiple channel driving buffer circuits, but also improving the quality of tone display when a multi-tone display unit is driven.

The present invention is characterized by, in a display data driving integrated circuit for driving a matrix display unit, comprising: a plurality of channel driving buffer circuits to which the individual bit signals of parallel display data are supplied and which, receiving an operation control signal, amplify the individual bit signals or perform voltage level conversion and output the resulting signals; a plurality of control signal supply lines for supplying the operation control signal to each of a plurality of groups into which the plurality of channel driving buffer circuits are divided; a single operation control signal input terminal to which an operation control signal for controlling the operation of the buffer circuits is supplied; a control signal input line for transferring the operation control signal input on the operation control signal input terminal; and an operation control signal distribution circuit for distributing the operation control signal on the control signal input line to the plurality of control signal supply lines with a specific timing relationship.

Because according to the invention, there is provided the operation control signal distribution circuit which distributes the operation control signal inputted from the operation control signal input terminal to the multiple control signal supply lines for supplying the operation control signal to each of the multiple groups into which the channel driving buffer circuits are divided, it is possible not only to suppress switching current in the channel driving buffer circuits, but also to improve the quality of tone display when a multi-tone display unit is driven by selecting the way of distribution by the operation control signal distribution circuit or the way of setting the timing relationship.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 5 is a logic circuit diagram of a display data driving IC according to a first embodiment of the present invention;

DETAILED DESCRIPTION OF THE PREFERRED EMBODIMENTS

Figure 1:
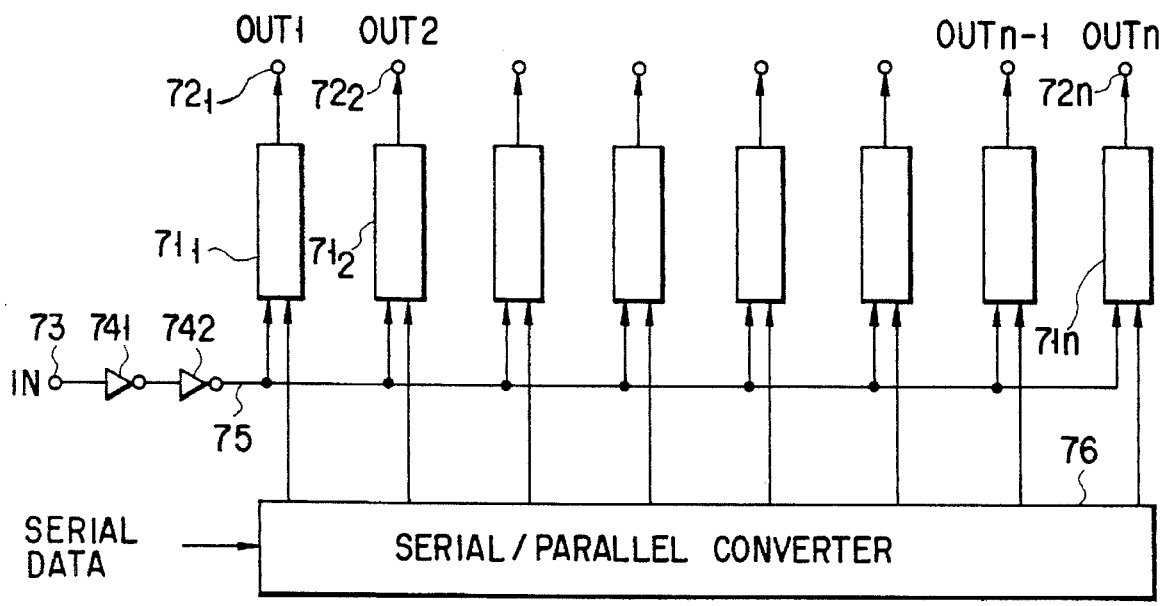
FIG. 1 is a logic circuit diagram of an example of the driving buffer circuit section in a conventional display data driving IC.
Figure 2:
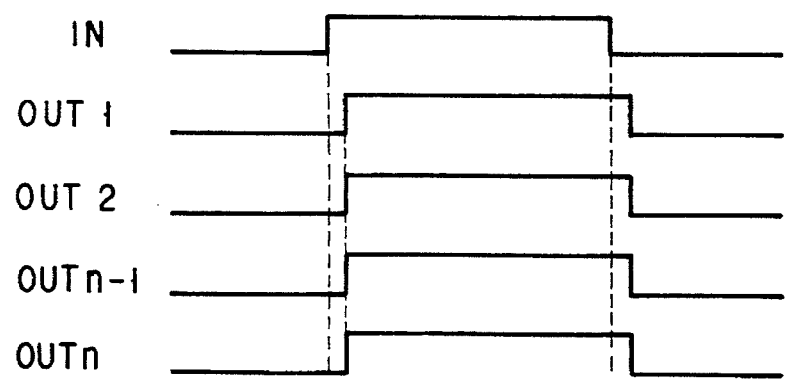
FIG. 2 is a timing waveform diagram of an example 10 of the operation of the driving buffer circuit section of FIG. 1.
Figure 3:
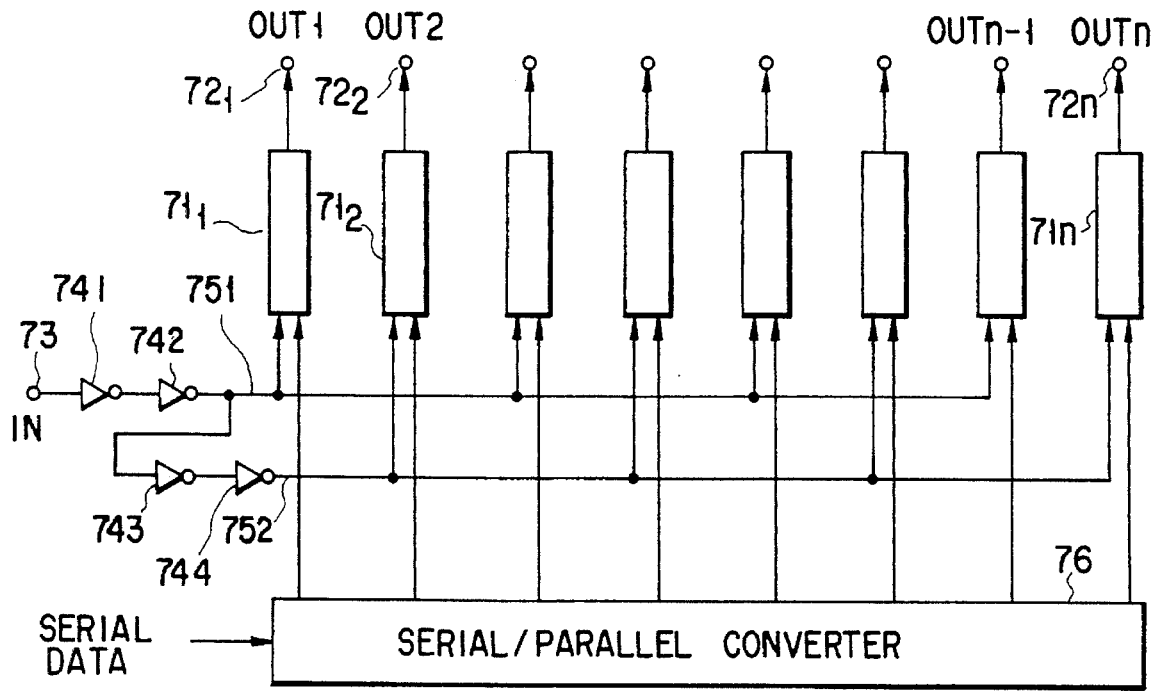
FIG. 3 is a logic circuit diagram of another example of the driving buffer circuit section in a conventional display data driving IC.
Figure 4:
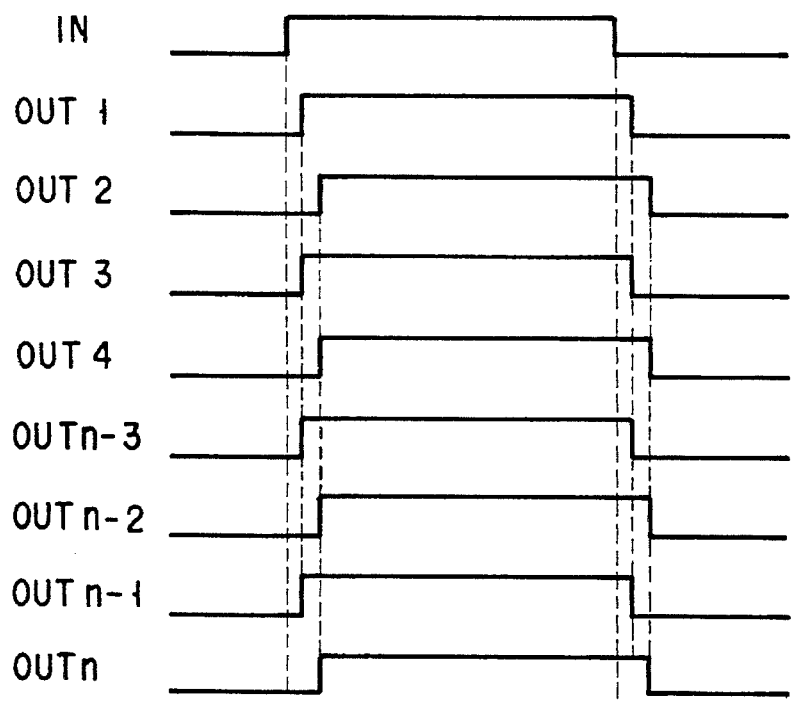
FIG. 4 is a timing waveform diagram of an example of the operation of the driving buffer circuit section of FIG. 3.

Hereinafter, an embodiment of the present invention will be explained, referring to the accompanying drawings.

FIG. 5 shows a portion of a display data driving IC which drives a matrix liquid-crystal unit by a dynamic technique, as a first embodiment of the present invention.

In FIG. 5, the display data Din supplied serially from a serial input terminal 11 is inputted to the first stage of a shift register 12. The shift register 12 converts the display data Din into, for example, 64 bits of parallel display data by shifting the Din input in synchronization with the shift clock CK supplied from the clock input terminal 13.

A transparent-type latch circuit 14 for a plurality of bits (64 bits in the embodiment) is used to take in the individual bit signals of the parallel data simultaneously from the shift register 12. The latch circuit is supplied with the latch signal LAT from a latch signal input terminal 15.

The 64-bit latch circuit 14 inputs signals to 64 gate circuits $16_1$ to $16_n$. Each of the gate circuits $16_1$ to $16_n$ is supplied with the gate control signal IN from the gate control terminal 17 via an operation control signal distribution circuit 18, thereby controlling the passing of the output of the 64-bit latch circuit 14.

The outputs of the 64 gate circuits $16_1$ to $16_n$ are supplied to 64 EXCLUSIVE-OR circuits $19_1$ to $19_n$, respectively. The individual EXCLUSIVE-OR circuits $19_1$ to $19_n$ are supplied with a polarity switching signal P/C from a polarity switching terminal 20, and directly supply the logic levels of the outputs of the 64 gate circuits $16_1$ to $16_n$ or invert them and supply the inverted logic levels.

The outputs of the 64 EXCLUSIVE-OR circuits $19_1$ to $19_n$ are supplied to 64 voltage converter circuits $22_1$ to $22_n$. The voltage converter circuits $22_1$ to $22_n$ convert the outputs of the 64 EXCLUSIVE-OR circuits $19_1$ to $19_n$ into specific high-voltage levels and output the converted levels through push-pull driving circuits (not shown), thus supplying output signals $OUT_1$ to $OUT_n$ for 64 bits as a dynamic driving signals to a matrix liquid-crystal display unit (not shown) via output terminals $23_1$ to $23_n$ for 64 bits.

With this arrangement, the 64 gate circuits $16_1$ to $16_n$, 64 EXCLUSIVE-OR circuits $19_1$ to $19_n$, 64 voltage converter circuits $22_1$ to $22_n$ constitute driving buffer circuits $24_1$ to $24_n$ for 64 channels as a whole, each driving buffer circuit consisting of a gate circuit, an EXCLUSIVE-OR circuit, and a voltage converter circuit.

The driving buffer circuit and its control circuit section in the IC of FIG. 5 will be described in detail.

Figure 6:
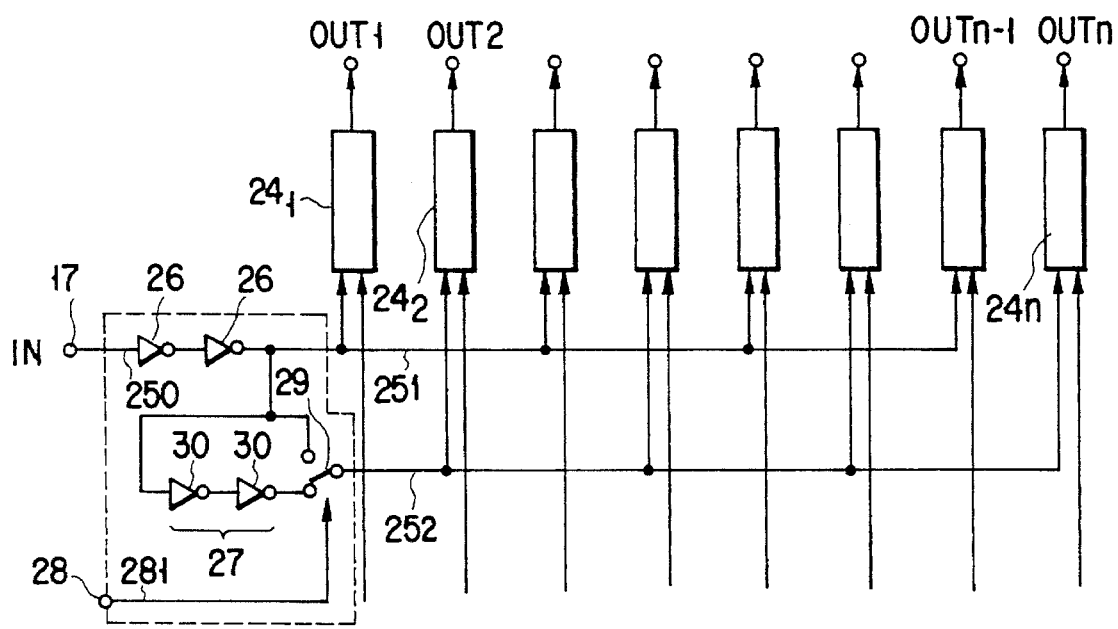
FIG. 6 is a circuit diagram of an example of the driving buffer circuit section and its control circuit section in FIG. 5.

FIG. 6 shows an example of the driving buffer circuit section and its control circuit section of FIG. 5.

The driving buffer circuit section, which is composed of driving buffer circuits $24_1$ to $24_n$ for 64 channels, is supplied with the individual bit signals of the parallel display data, and when receiving the operation control signal, amplify the individual bit signals or perform voltage-level conversion of them and output the converted signals.

The driving buffer circuit section is divided into two groups. One and the other groups of (the gate circuits $16_1$ to $16_n$ of) the driving buffer circuits $24_1$ to $24_n$ are provided with a first control signal supply line 251 and a second control signal supply line 252, respectively. In this embodiment, the odd-numbered (odd channel) ones of the driving buffer circuits $24_1$ to $24_n$ are all supplied with the operation control signal from the first control signal supply line 251, and the even-numbered (even channel) driving buffer circuits are all supplied with the operation control signal from the second control signal supply line 252.

The control circuit section comprises a control signal input line 250 connected to a single operation control signal input terminal (corresponding to the gate control terminal 17 to which the gate control signal /CL is supplied in FIG. 5) to which the operation control signal for controlling the operation of the driving buffer circuits $24_1$ to $24_n$ is supplied, and an operation control signal distribution circuit 18 for distributing the operation control signal on the control signal input line 250 to the multiple control signal supply lines 251, 252 with a specific timing relationship.

The operation control signal distribution circuit 18 comprises a delay circuit 27 for delaying the operation control signal supplied from the control signal input line 250 and outputting the delayed signal to at least one of the multiple control signal supply lines 251, 252, a switching circuit 29 designed to select either a connecting path between the control signal input line 250 and the delay circuit 27 or a connecting path between the delay circuit 27 and the control signal supply lines 251, 252, and a switch control signal input terminal 28 to which a switching control signal for controlling the switching circuit 29 is supplied.

In the present embodiment, the operation control signal distribution circuit 18 comprises a two-stage inverter circuit 26 for waveform-shaping the operation control signal supplied from the control signal input line 250 and supplying the shaped signal to the first control signal supply line 251, a delay circuit 27 (e.g., a two-stage inverter circuit 30) to which the output signal of the inverter circuit 26 in supplied and which delays it for a specified period of time, a timing adjust control terminal 28 to which a timing adjust control signal is supplied, and a switching circuit 29 which is controlled by the signal supplied from the terminal 28 and which selects either the operation control signal on the first control signal supply line 251 or the output signal of the delay circuit 27 and supplies the selected signal to the second control signal supply line 252.

The switching circuit 29 determines whether the delay circuit 27 connected between the first control signal supply line 251 and the second control signal supply line 252 is used or bypassed. The circuit may be composed of, for example, a switching element and switch control circuit using MOS transistors.

Figure 7A:
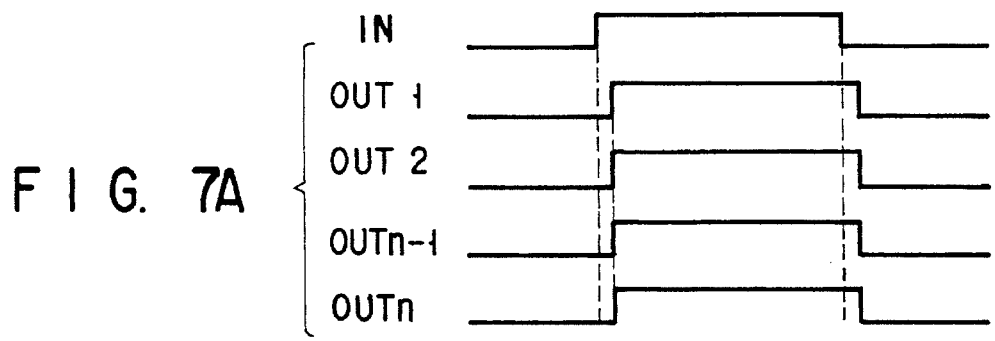
FIGS. 7A and 7B are timing waveform diagrams of examples of the operation of the circuit in FIG. 6.
Figure 7B:
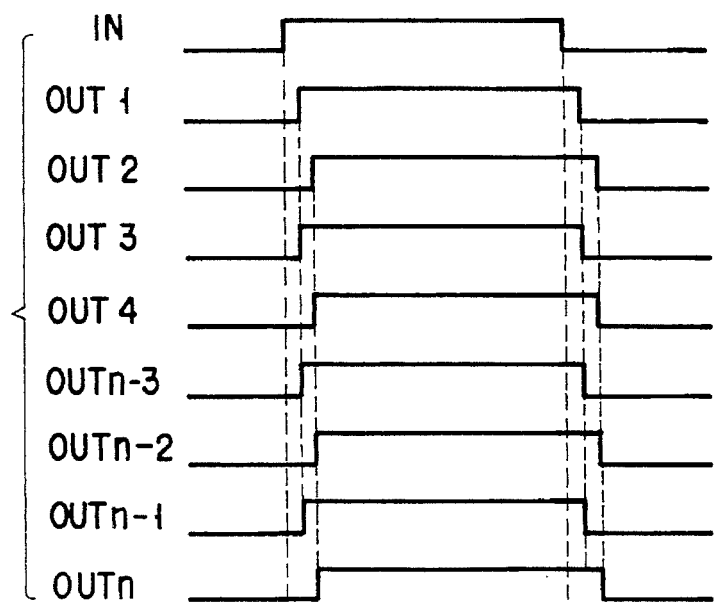

FIGS. 7A and 7B show an example of the operation of the circuit of FIG. 6.

It is assumed that in the control circuit section of FIG. 6, the switching circuit 29 is controlled so as to select the operation control signal on the first control signal supply line 251 and supply the selected signal to the second control signal supply line 252. In this state, the odd-channel driving buffer circuits to which the first control signal supply line 251 supplies an operation control signal in common and the even-channel driving buffer circuits to which the second signal supply line 252 supplies an operation control signal operate simultaneously. Then, the driving buffer circuits $24_1$ to $24_n$ produce output signals $OUT_1$ to $OUT_n$ which have a timing relationship as shown in FIG. 7A.

When the switching circuit 29 is controlled so as to select the output signal of the delay circuit 27 and supply it to the second control signal supply line 252, one half of the driving buffer circuits $24_1$ to $24_n$ operate with a slightly different timing from the other half according to two phases of the operation control signal. The driving buffer circuits then produce output signals $OUT_1$ to $OUT_n$ which have a timing relationship as shown in FIG. 7B.

With the control circuit section of FIG. 6, it is possible to select one from two types of the operation timing pattern of multiple channel driving buffer circuits.

Figure 8:
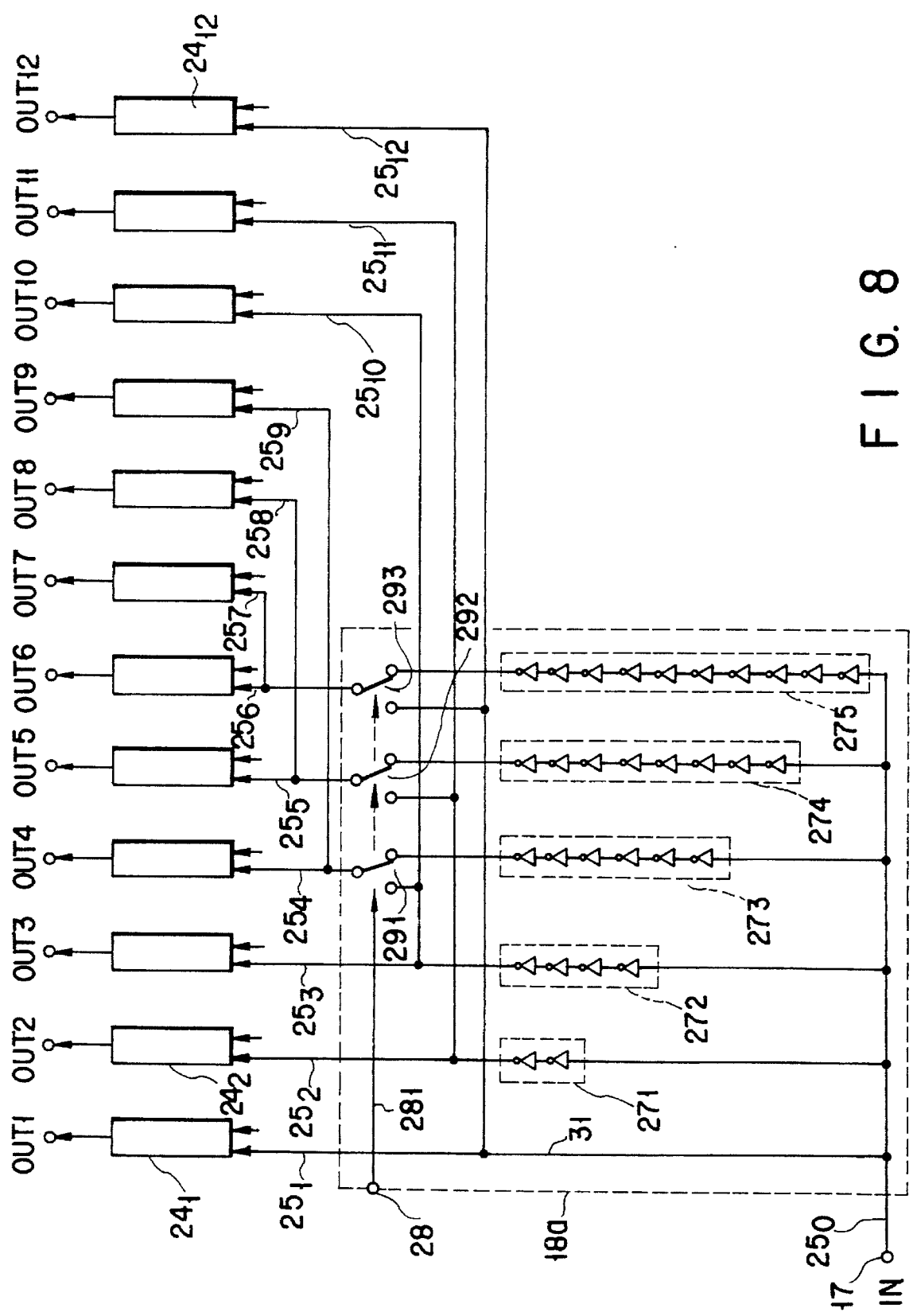
FIG. 8 is a logic circuit diagram of a modification of the control circuit in FIG. 6.

FIG. 8 is a logic circuit diagram of a modification of the control circuit section in FIG. 6. To simplify explanation, 12 driving buffer circuits $24_1$ to $24_{12}$ are shown.

The driving buffer circuits $24_1$ to $24_{12}$ in FIG. 8 are divided into six groups. Six control signal supply lines (a first to sixth control signal supply lines) $25_1$ to $25_6$ are provided so as to supply an operation control signal to each group. In this embodiment, the n-th (n=1, 2, 3, 4, 5, 6) and the (12−n+1)-th ones of the driving buffer circuits $24_1$ to $24_n$ are all supplied with the operation control signal from the n-th control signal supply line $25_n$.

The control circuit section contains a single operation control signal input terminal 17 to which an operation control signal IN for controlling the operation of the driving buffer circuits $24_1$ to $24_{12}$ is supplied, a control signal input line 250 connected to the input terminal 17, and an operation control signal distribution circuit 18a for distributing the operation control signal on the control signal input line 250 to the six control signal supply lines $25_1$ to $25_6$ with different timing from line to line.

The operation control signal distribution circuit 18a comprises a wire 31 for directing the signal on the control signal input line 250 to the first control signal supply line $25_1$ and the twelfth control signal supply line $25_{12}$, a first delay circuit (composed of a two-stage inverter circuit) 271 for receiving and delaying the signal on the control signal input line 250, a second delay circuit (composed of a four-stage inverter circuit) 272 for receiving the signal on the control signal line 250 and delaying it for a longer time than the first delay circuit 271, a third delay circuit (composed of a six-stage inverter circuit) 273 for receiving the signal on the control signal line 250 and delaying it for a longer time than the second delay circuit 272, a fourth delay circuit (composed of an eight-stage inverter circuit) 274 for receiving the signal on the control signal line 250 and delaying it for a longer time than the third delay circuit 273, a fifth delay circuit (composed of a ten-stage inverter circuit) 275 for receiving the signal on the control signal line 250 and delaying it for a longer time than the fourth delay circuit 274, a timing adjust control terminal 28 to which a timing adjust control signal is supplied, and a first to third switching circuits 291 to 293 which are each switched by the signal supplied from the terminal 28.

The output signal of the first delay circuit 271 is supplied to the second control signal supply line $25_2$ and the eleventh control signal supply line $25_{11}$. The output signal of the second delay circuit 272 is supplied to the third control signal supply line $25_3$ and the tenth control signal supply line $25_{10}$. The first switching circuit 291 selects either the operation control signal on the third (or the tenth) control signal supply line $25_3$ or the output signal of the third delay circuit 273 and supplies the selected signal to the fourth control signal supply line $25_4$ and the ninth control signal supply line $25_9$.

The second switching circuit 292 selects the operation control signal on the second (or the eleventh) control signal supply line $25_2$ or the output signal of the fourth delay circuit 274 and supplies the selected signal to the fifth control signal supply line $25_5$ and the eighth control signal supply line $25_8$. The third switching circuit 293 selects the operation control signal on the first (or the twelfth) control signal supply line $25_1$ or the output signal of the fifth delay circuit 275 and supplies the selected signal to the sixth control signal supply line $25_6$ and the seventh control signal supply line $25_7$.

Figure 9:
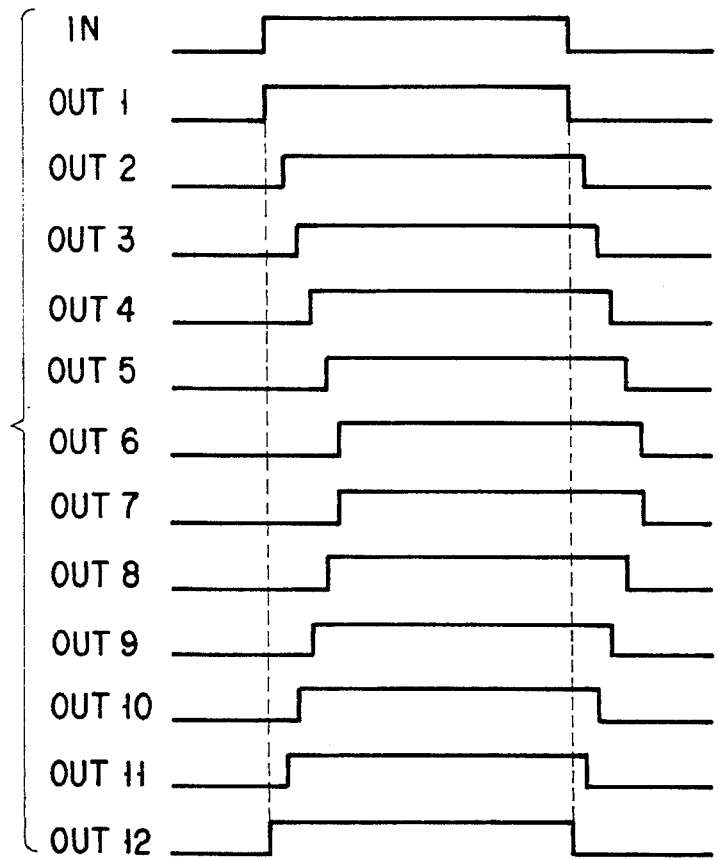
FIG. 9 is a timing waveform diagram of an example of the operation of the circuit in FIG. 8.
Figure 10:
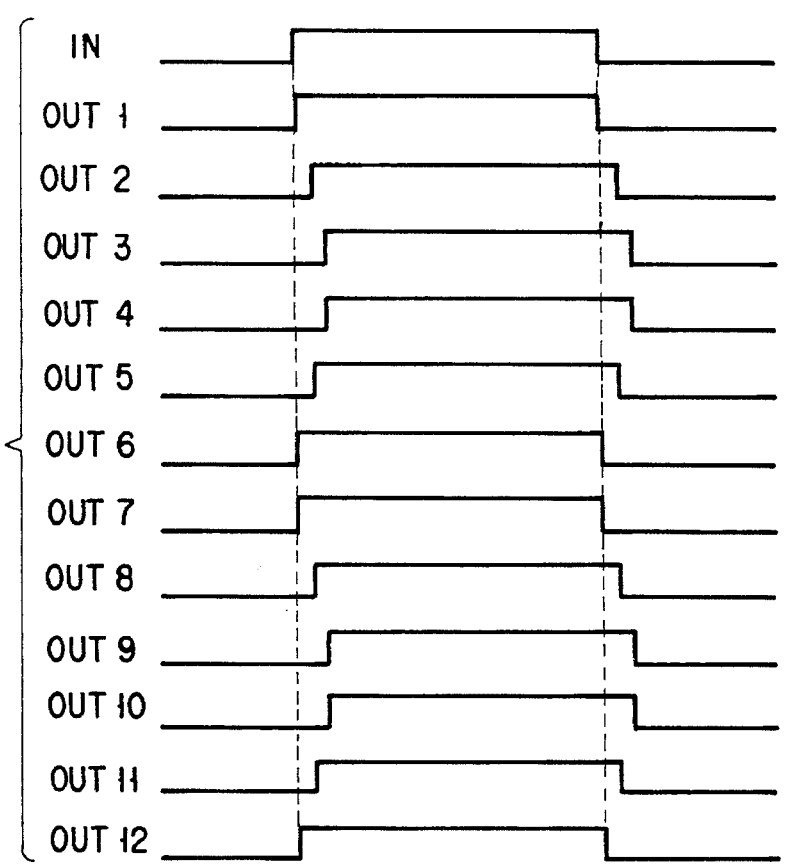
FIG. 10 is a timing waveform diagram of another example of the operation of the circuit in FIG. 8.

FIGS. 9 and 10 show different examples of the operation of the circuit in FIG. 8.

It is assumed that in the control circuit section of FIG. 8, the first switching circuit 291 selects the output signal of the third delay circuit 273, the second switching circuit 292 selects the output signal of the fourth delay circuit 274, and the third switching circuit 293 selects the output signal of the fifth delay circuit 275.

In this state, the operation control signal distribution circuit 18a can adjust the timing so that the phases of the individual operation control signals on the first to sixth control signal supply lines $25_1$ to $25_6$ may be delayed one after another and the phases of the individual operation control signals on the seventh to twelfth control signal supply lines $25_7$ to $25_{12}$ may be advanced one after another. This allows the driving buffer circuits $24_1$ to $24_{12}$ to produce output signals $OUT_1$ to $OUT_{12}$ which have a timing relationship as shown in FIG. 9.

Now, it is assumed that in the circuit of FIG. 8, the first switching circuit 291 selects the operation control signal on the third control signal supply line $25_3$, the second switching circuit 292 selects the operation control signal on the second control signal supply line $25_2$, and the third switching circuit 293 selects the operation control signal on the first control signal supply line $25_1$.

In this state, the operation control signal distribution circuit 18a can adjust the timing so that the phases of the individual operation control signals on the first to third control signal supply lines $25_1$ to $25_3$ may be delayed one after another, the phases of the individual operation control signals on the fourth to sixth control signal supply lines $25_4$ to $25_6$ may be advanced one after another, the phases of the individual operation control signals on the seventh to ninth control signal supply lines $25_7$ to $25_9$ may be delayed one after another, and the phases of the individual operation control signals on the tenth to twelfth control signal supply lines $25_{10}$ to $25_{12}$ may be advanced one after another. This allows the driving buffer circuits $24_1$ to $24_{12}$ to produce output signals $OUT_1$ to $OUT_{12}$ which have a timing relationship as shown in FIG. 10.

With the control circuit section of FIG. 8, it is possible to select one of two types of the operation timing pattern of the multiple channel driving buffer circuits.

There may be a case where the number of channels in the driving buffer circuit section in a display data driving IC is as many as 80 to 280. In this case, it is possible to set the operation timing of multiple channel driving buffer circuits by increasing the number of the delay circuits 271 to 275 to increase the delay time through more stages, by dividing the driving buffer circuits $24_1$ to $24_n$ into three or more groups, or by combining those groups.

Furthermore, by increasing the number of the timing adjust control terminal 28 and the switching circuit 291 to 293 and selectively setting the switching pattern of the multiple switching circuits by multiple timing adjust control inputs, it is possible to select one of three or more types of the operation timing of the multiple channel driving buffer circuits.

The display data driving IC of the embodiment is provided with the operation control signal distribution circuit 18 which distributes the operation control signal supplied from the operation control signal input terminal 17 to the multiple control signal supply lines for supplying the operation control signal to each of the multiple groups into which the multiple channel driving buffer circuits $24_1$ to $24_n$ are divided.

Therefore, since it is possible to select the way of distribution by the operation control signal distribution circuit 18 and the way of setting its timing relationship, switching current in the multiple channel driving buffer circuits $24_1$ to $24_n$ can be suppressed and when a multi-tone display unit is driven for display, the operation control signal distribution circuit 18 can be used so as to improve the multi-tone display quality.

Specifically, with the display unit being driven by the display data driving IC of the embodiment, it is possible to provide an optimum setting for each display unit by changing the way of distribution by the operation control signal distribution circuit 18 and the way of setting its timing relationship to check the switching current, the display quality, etc. The feature of enabling highly flexible setting in selecting a display driving timing pattern allows use of only one type of display data driving IC for several types of display units differing form each other in the display panel size, the display panel material, the display operating speed, the operating voltage, the display method (monochrome, tone, the number of tones). This enables mass production through standardization of display data driving ICs, making it possible to reduce the cost of display data driving ICs remarkably.

As a modification of the control circuit section in FIGS. 6 and 8, the timing adjust control terminal 28 and the switching control signal line 281 connected to this terminal may be eliminated and instead a line (not shown) may be provided so as to select either a connecting path between the control signal input line and the delay circuit or a connecting path between the delay circuit and the control signal supply line. In this case, if the delay circuit output wire and the control signal supply line are made of a metal wire (e.g., an aluminium wire), the wire has only to be formed at a specific junction (short-circuited) point between the metal wires so as to set the distribution by the operation control signal distribution circuit 18 and its timing relationship as desired. This wire can be selected and set from aluminium options by a master slice method and is suitable for mass production of display data driving ICs.

The present invention can be applied to a display data driving IC which drives a color liquid-crystal display unit, for example. In this case, the individual bit signals of parallel display data supplied to the multiple channel driving buffer circuits $24_1$ to $24_n$ of the embodiment are given in units of, for example, four bits corresponding to the R (red) component, G (green) component, B (blue) component, and luminance. When each of the R, G, B, and luminance signals has 16 tones, it is pulse-modulated according to the 16 tones.

As described above, with the display data driving IC of the present invention, switching current in the multiple channel driving buffer circuits can be suppressed, and the gradation display quality can be improved when a multi-tone display unit is driven.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A display data driving integrated circuit comprising:

a plurality of channel driving buffer circuits to which individual bit signals of parallel display data are supplied and which, upon receiving an operation control signal, amplify the individual bit signals or perform voltage level conversion and output the resulting signals;

a plurality of control signal supply lines for supplying said operation control signal to each of a plurality of groups into which said plurality of channel driving buffer circuits are divided;

operation control signal input terminal to which said operation control signal for controlling the operation of said buffer circuits is supplied;

an operation control signal input line connected to said operation control signal input terminal; and a phase mode control circuit for changing a timing of said supplying of said operation control signal to those of said buffer circuits which are in one group selected from said groups of said buffer circuits to change phase modes of output signals of said buffer circuits of said selected group.

2. A display data driving integrated circuit according to claim 1, wherein said phase mode control circuit comprises:

a delay circuit for delaying said operation control signal supplied from said operation control signal input line and supplying the delayed signal to at least one of said plurality of control signal supply lines;

a switching circuit formed so as to select either a connecting path between said operation control signal input line and said delay circuit or a connecting path between said operation control signal input line and at least one of said plurality of control signal supply lines; and a switch control signal input terminal to which a switch control signal for controlling said switching circuit is supplied.

3. A display data driving integrated circuit according to claim 1, wherein said phase mode control circuit comprises:

a delay circuit for delaying said operation control signal supplied from said operation control signal input line and supplying the delayed signal to at least one of said plurality of control signal supply lines; and a wire formed so as to select either a connecting path between said operation control signal input line and said delay circuit or a connecting path between said delay circuit and at least one of said plurality of control signal supply lines.

4. A display data driving integrated circuit according to claim 1, wherein said phase mode control circuit changes said timing of said supplying of said operation control signal to said buffer circuits of said selected group to change said phase modes of said output signals of said buffer circuits of said selected group.

5. A display data driving integrated circuit according to claim 4, wherein said phase mode control circuit comprises:

a delay circuit for receiving and delaying said operation control signal; and a switch circuit for allowing said operation control signal on said operation control signal input line or an output signal of said delay circuit, to be supplied to said buffer circuits of said selected group in accordance with a switch control signal.

6. A display data driving integrated circuit according to claim 5, wherein said phase mode control circuit further includes a switch control signal input terminal to which said switch control signal is supplied.

7. A display data driving integrated circuit according to claim 1, wherein said phase mode control circuit comprises:

a plurality of delay circuits having different delay times, for receiving and delaying said operation control signal; and a switch circuit for allowing output signals of said delay circuits to be supplied to said buffer circuits of said selected group, in a corresponding relationship or another relationship between said delay circuits and said buffer circuits of said selected group, in accordance with a switch control signal.

8. A display data driving integrated circuit according to claim 7, wherein said phase mode control circuit further includes a switch control signal input terminal to which said switch control signal is supplied.

* * * * *